United States Patent [19]
Cho

[11] Patent Number: 5,937,326
[45] Date of Patent: Aug. 10, 1999

[54] METHOD FOR MAKING SEMICONDUCTOR DEVICE HAVING VIA HOLE

[75] Inventor: Gyung-Su Cho, Kyoungki-do, Rep. of Korea

[73] Assignee: Hyundai Electronics Industries Co., Ltd., Kyoungki-do, Rep. of Korea

[21] Appl. No.: 08/655,404

[22] Filed: May 30, 1996

[30] Foreign Application Priority Data

Jun. 9, 1995 [KR] Rep. of Korea ............ 95-15177

[51] Int. Cl.$^6$ .................................................. H01L 21/44
[52] U.S. Cl. .......................... 438/669; 438/585; 438/666
[58] Field of Search ................................ 438/669, 671, 438/672, 666, 668, 738, 740, 742, 734

[56] References Cited

U.S. PATENT DOCUMENTS

| | | | |
|---|---|---|---|
| 3,878,008 | 4/1975 | Gleason et al. | 438/734 |
| 4,715,930 | 12/1987 | Diem | 438/734 |
| 4,917,759 | 4/1990 | Fisher et al. | 438/669 |
| 4,954,423 | 9/1990 | McMann et al. | 438/625 |
| 5,124,780 | 6/1992 | Sandhu et al. | 438/672 |
| 5,424,247 | 6/1995 | Sato | 438/639 |
| 5,436,199 | 7/1995 | Brighton | 438/626 |
| 5,449,639 | 9/1995 | Wei et al. | 438/671 |
| 5,492,855 | 2/1996 | Matsumoto et al. | 438/669 |
| 5,646,449 | 7/1997 | Nakamura et al. | 257/761 |
| 5,665,641 | 9/1997 | Shen et al. | 438/643 |
| 5,665,642 | 9/1997 | Kato | 438/669 |
| 5,880,015 | 3/1999 | Hata | 438/585 |

FOREIGN PATENT DOCUMENTS 5166940 7/1993 Japan .
6314687 11/1994 Japan .

OTHER PUBLICATIONS

Wolf et al., Silicon Processing For The VLSI Era, vol. I, Lattice Press, pp. 439–441, 1986.

Wolf et al., Silicon Processing For The VLSI Era, vol. II, Lattice Press, p. 128, 1990.

Patent Abstracts of Japan, Publication No. 05166940, Jul. 2, 1993.

Patent Abstract of Japanese Laid–Open No. 6–314687, Nov. 8, 1994.

Primary Examiner—John F. Niebling
Assistant Examiner—Lynne A. Gurley
Attorney, Agent, or Firm—Ware, Fressola, Van Der Sluys & Adolphson LLP

[57] ABSTRACT

A method for making a semiconductor device having a via hole, includes the steps of depositing a second metal layer onto a first insulating layer formed on a semiconductor substrate where a first metal layer is formed on its lower surface, and forming a first photoresist layer. The second metal layer is then etched, using the first photoresist layer as a first etching mask, to form a metal line. Thereafter, the first photoresist layer is removed and a second photoresist layer is formed over the metal line. The metal line is etched, using the second photoresist layer as a second etching mask, to make the metal line protrude. The inventive method further includes a step for depositing a second insulating layer onto the metal line, forming a third photoresist layer on the second insulating layer, and etching the second insulating layer, using the third photoresist layer as a third etching mask, for the formation of a via hole on the metal line.

10 Claims, 4 Drawing Sheets

PRIOR ART

METHOD FOR MAKING SEMICONDUCTOR DEVICE HAVING VIA HOLE

BACKGROUND OF THE INVENTION

1. Field of the Invention

The present invention relates to a method for manufacturing miconductor device. More particularly, it relates to a method for manufacturing a semiconductor device having a via hole for electrical connection between upper and lower electrodes.

2. Description of Prior Art

Generally, a semiconductor device has a via hole through which current flows from an external power supply into an active region of an insulating layer formed on a semiconductor device which is deposited with a first metal layer on its lower surface. FIGS. 1A to 1C depict the conventional steps in the manufacture of the semiconductor device with a via hole.

Referring to FIG. 1A, a first insulating layer 21 is deposited on a semiconductor substrate 20 having a first metal layer on its lower surface (not shown), and a second metal layer 22 such as aluminum is deposited onto the insulating layer 21 for the formation of metal lines. In order to prevent irregular reflection from the second metal layer 22 deposited onto the first insulating layer 21 when performing a photolithographic process, a third metal layer 23 is formed on the second metal layer 22. A first photoresist layer 24 is then coated on the third metal layer 23 to serve as an etching mask for the formation of the metal line. Thereafter, the second metal layer 22 and the third Metal layer 23 are etched away, using the first photoresist layer 24 as an etching mask, whereby a metal line is formed by the metal layers 22 and 23 on the insulating layer 21 as shown in FIG. 1B.

Referring now to FIG. 1B, a second insulating layer 25 is deposited over the first insulating layer 21 to surround both of the second metal layer 22 and the third metal layer 23. A second photoresist layer 26 is coated on the second insulating layer 25, and the metal layers 22 and 23 are etched using the pattern of the second photoresist layer 26 as an etching mask, so that a via hole 27 is formed in the semiconductor device as shown in FIG. 1C.

With the formation of the via hole 27, however, is the formation of an undercut 28 located at the bottom area of the via hole 27, on the upper portion of the metal layer 22. The undercut 28 is caused by excessive etching of the metal layers 22 and 23. When a metal line is formed on the second metal layer 22 over the undercut 28, the metal line becomes too thin around the edge of the bottom of the via hole 27 to achieve good step coverage, which may result in disconnection of the metal line to make matters worse. Thefore, the undercut is one of the principal causes of the low reliability problem.

SUMMARY OF THE INVENTION

It is an object of the present invention to provide a method for manufacturing a semiconductor device having a via- hole that prevents the formation of an undercut and enhances reliability of a semiconductor device.

In order to achieve the above object, in accordance with one embodiment of the present invention, there is provided a method for making a semiconductor device having a via hole comprising the steps of: depositing a second metal layer onto a first insulating layer formed on a semiconductor substrate where a first metal layer is formed on its lower surface; forming a first photoresist layer on said second metal layer and etching said second metal layer, using said first photoresist layer as a first etching mask, to form a metal line; removing said first photoresist layer, forming a second photoresist layer over said metal line, and etching said metal line, using the second photoresist layer as a second etching mask, to make said metal line protrude; and depositing a second insulating layer onto said metal line, forming a third photoresist layer on said second insulating layer, and etching said second insulating layer, using the third photoresist layer as a third etching mask, to open a via hole on said metal line.

In accordance with another embodiment of the present invention, a method for making a semiconductor device having a via hole comprises the steps of: depositing a second metal layer onto a first insulating layer formed on a semiconductor substrate where a first metal layer is formed on its lower surface; forming a first photoresist layer, firstly etching said second metal layer, using said first photoresist layer as a first etching mask to make a first metal line protruding from said second metal layer; forming a second photoresist layer to surround the metal line, and secondly etching said second metal layer further to make an enlarged metal line protruding from said first insulating layer and including said first metal line thereon, using said second photoresist layer as a second etching mask, and then removing said second photoresist layer; and forming a second insulating layer over said enlarged metal line, forming a third photoresist layer on said second insulating layer, and etching said second insulating layer, using said third photoresist layer as a third etching mask for the formation of a via hole on said first metal line.

The above first and second embodiments of the present invention may further includes the step of depositing a third metal layer for preventing reflection that results in inaccurate etching during the photolithographic process, prior to the step for etching the second metal layer formed on the first insulating layer to form a metal line. In addition, the third metal layer for preventing reflection is excessively etched to reduce the resistance of the via hole when the second insulating layer is etched in the formation of the via hole. Alternatively, a dry-etching technique is used for the protruding formation of the metal line and for the formation of the via hole.

The second insulating layer in the present invention does not mean a second-layer insulating film but an insulating film having a via hole of third, fourth, fifth layers in a multi-layered structure of a semiconductor device.

DETAILED DESCRIPTION OF PREFERRED EMBODIMENT

Preferred embodiments of the present invention are described in detail with reference to the accompanying drawings.

FIGS. 2A to 2D are sectional views showing the steps in the manufacture of a semiconductor device having a via hole in accordance with a first preferred embodiment of the present invention.

Figure 1A:
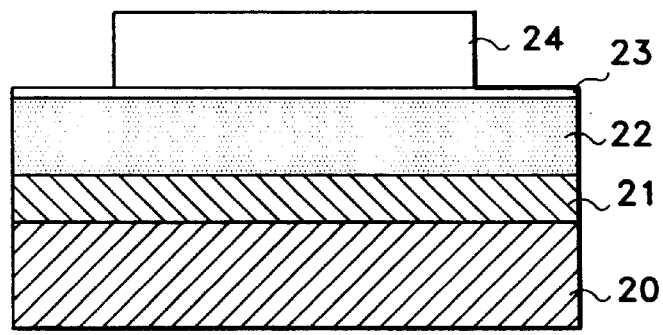
FIGS. 1A to 1C are sectional views showing the steps in the manufacture of a semiconductor device having a via hole according to the conventional method.
Figure 1B:
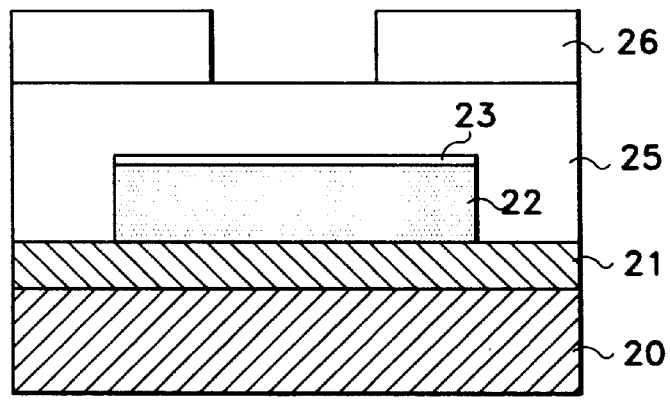
Figure 1C:
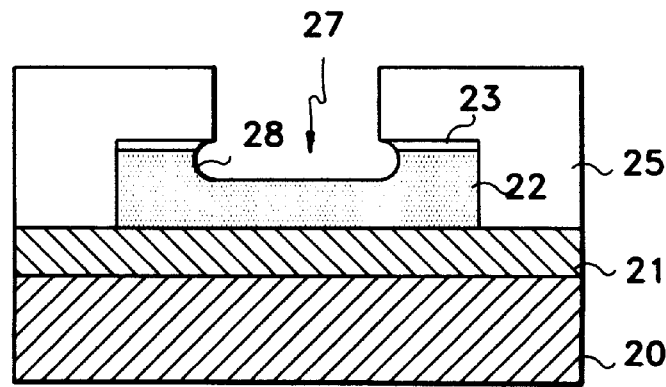
Figure 2A:
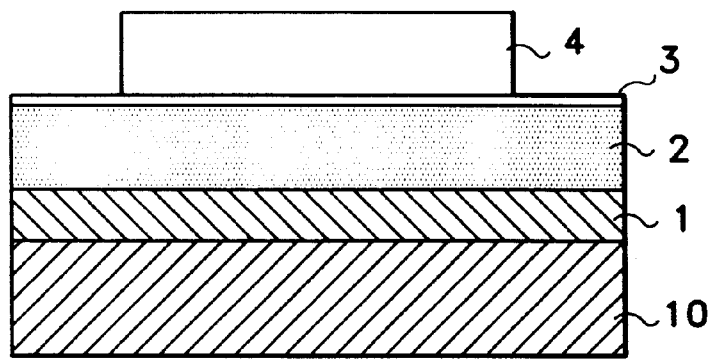
FIGS. 2A to 2D are sectional views showing the steps in the manufacture of a semiconductor device having a via hole in accordance with a first preferred embodiment of the present invention.

Referring to FIG. 2A, a first insulating layer 1 is deposited on a semiconductor substrate 10 having a lower first metal layer (not shown). Thereafter, a second metal layer 2 such as aluminum is deposited onto the first insulating layer 1 to form a metal line 9 to be described below in connection with FIGS 2B–2D. A third metal layer 3 may be formed on the metal layer 2 to prevent inaccurate etching due to irregular reflection from the metal layer 2 during the photolithographic process. The third metal layer 3 is made from a material such as titanium nitride having a high resistivity, for example, more than 25 $\mu\Omega$-cm.

Figure 2B:
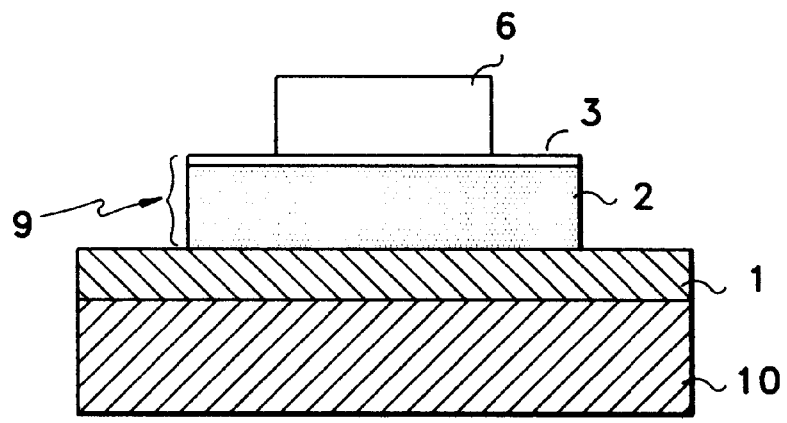
Figure 2C:
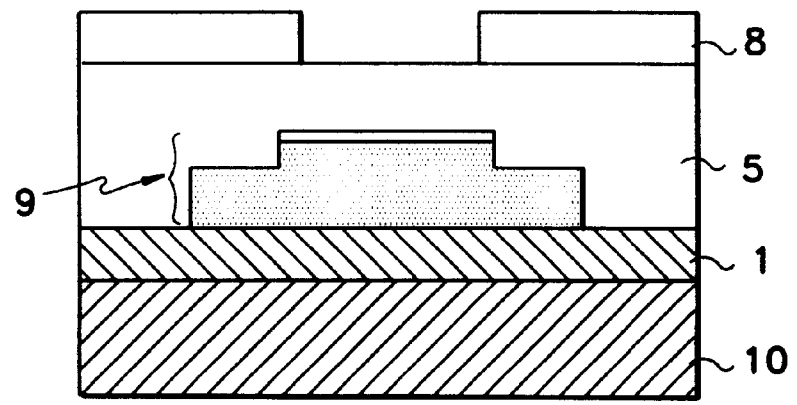

A photoresist layer 4 that serves as a first mask pattern to form a metal line is deposited onto the third metal layer 3. Partial etching of sections of the second metal layer 2 and the third metal layer 3 that are not covered by the photoresist layer 4 then takes place, i.e., these sections are etched away to expose underlying sections of the first insulating layer 1, using the first photoresist layer 4 as a mask, and thus, a metal line 9 is formed as shown in FIG. 2B. The first photoresist layer 4 is then removed. A photoresist layer 6 serving as a second mask pattern is deposited all over the metal line 9. The metal line 9 is etched away along the second mask pattern of the photoresist layer 6 so that the surface of the metal line 9 becomes protruded as shown in FIG. 2C. Portions of the metal line 9 except the protruding portion forming the bottom of the via hole, or the peripheral portions of the via hole are formed to have a predetermined thickness at the first insulating layer 1.

The second photoresist layer 6 is removed, and a second insulating layer 5 is deposited onto the metal line 9, which is depicted in FIG. 2C. A third photoresist layer 8, is formed on the second insulating layer 5, to be patterned and serve as a third mask for exposing and developing the portion where a via hole is formed.

Figure 2D:
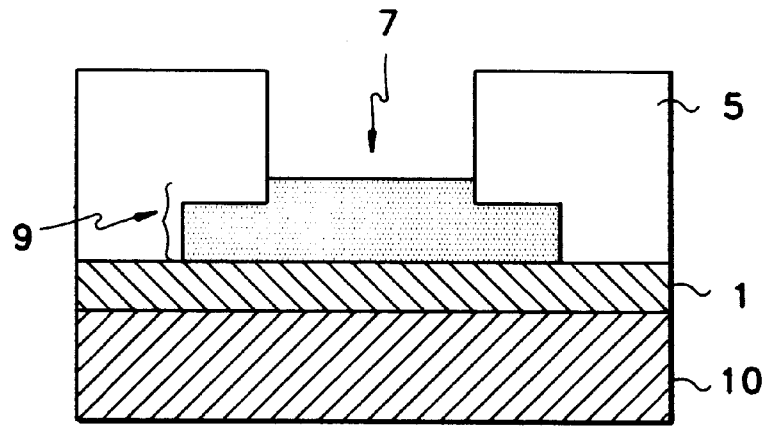

A portion of the second insulating layer 5 is etched away, using the third photoresist layer 8 as the third mask. This etching process is also carried out to remove the third metal layer 3 in such a manner that a via hole 7 is formed as shown in FIG. 2D. Since the portion of the metal line 9 that is to be the bottom of the via hole 7 is formed to be thicker than the peripheral area of the via hole, an undercut is not formed. This remains true, even if the third metal layer 3, the bottom of the via hole 7, is excessively etched to reduce the resistance of the via hole. In regards to the whole process, a dry etching process is preferably used to protrude the metal line and to form the via hole.

FIGS. 3A to 3D are sectional views showing the steps in the manufacture of a semiconductor device having a via hole in accordance with a second preferred embodiment of the present invention.

Figure 3A:
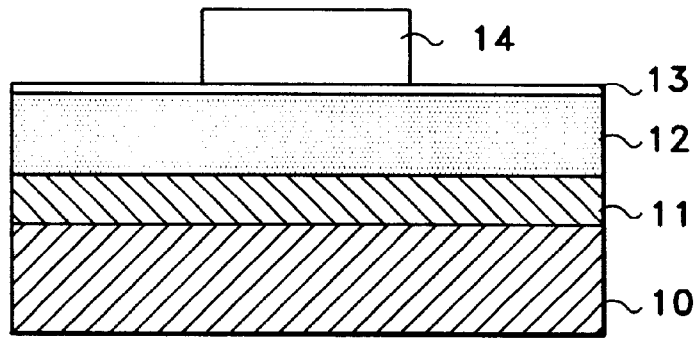
FIGS. 3A to 3D are sectional views showing the steps in the manufacture of a semiconductor device having a via hole in accordance with a second preferred embodiment of the present invention.
Figure 3B:
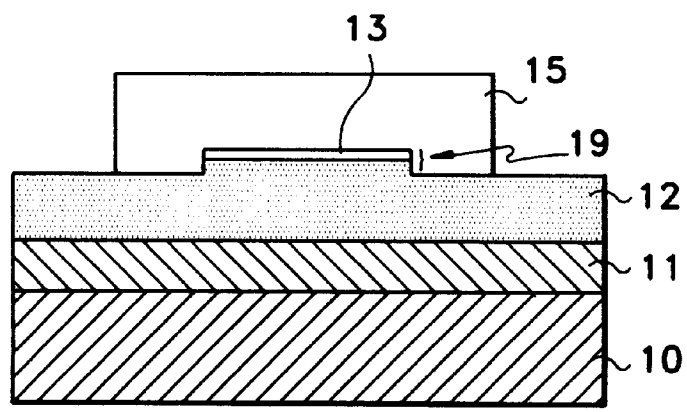

As shown in FIG. 3A, a first insulating layer 11 is formed on a semiconductor substrate 10 on which a first metal layer is formed at the lower surface (not shown), and a second metal layer 12 made from a material such as aluminum is formed on the first insulating layer 11 to form a metal line.

Figure 3C:
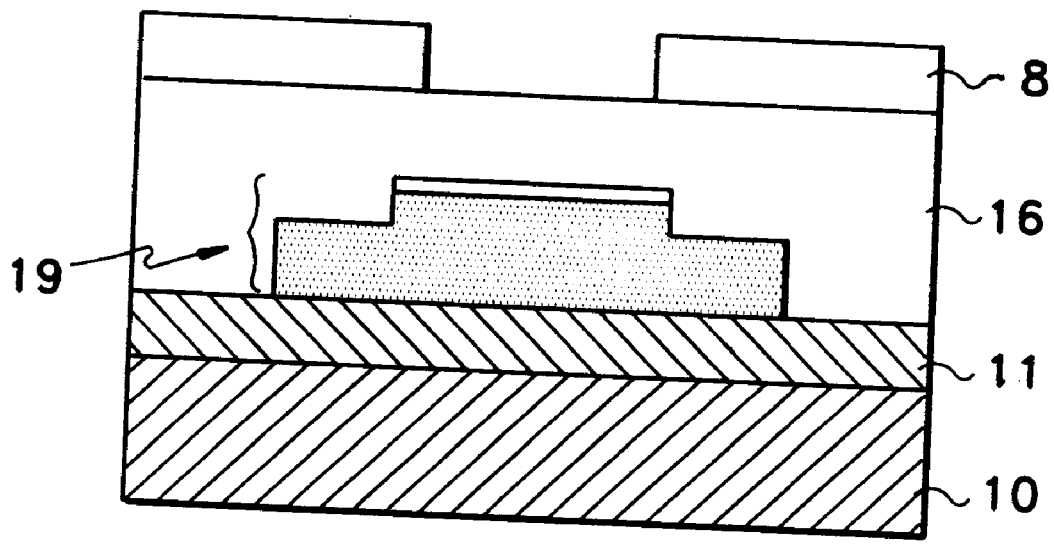
Figure 3D:
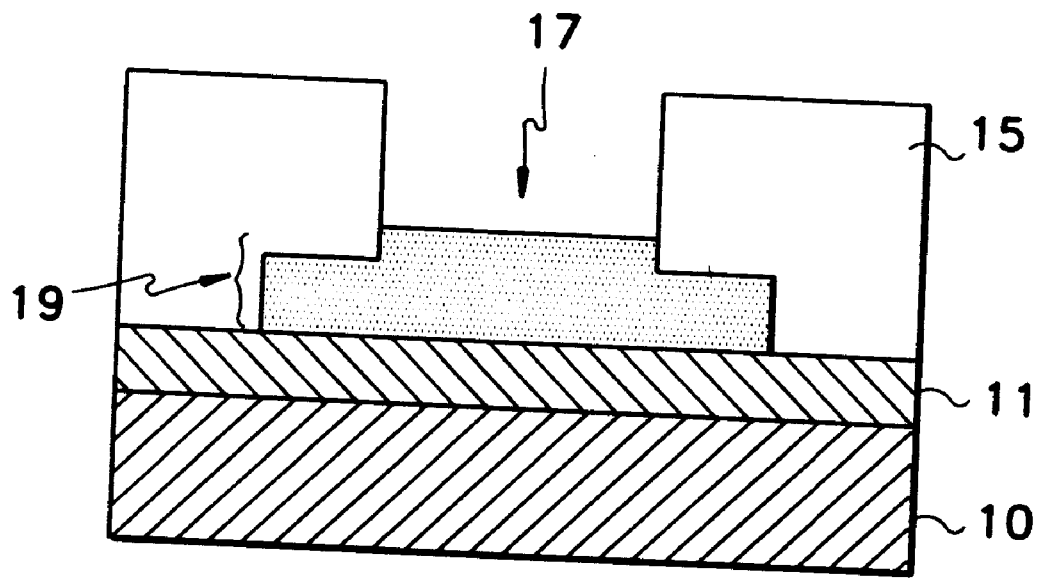

A third metal layer 13 may be formed on the metal layer 12 to prevent inaccurate etching due to irregular reflection from the metal layer 12 during the photolithographic process. In this embodiment, the third metal layer 13, made from a material such as titanium nitride, has a relatively high resistivity of over 25 $\mu\Omega$-cm. A first photoresist layer 14 is formed on the third metal layer 13 patterned to serve as a mask to form a metal line 19 to be discussed. By means of the photoresist layer 14 used as a mask, partial etching of the second metal layer 12 and the reflection-preventing third metal layer 13 results in portions of the second metal layer 12 being removed in such a manner that the metal line 19 formed of the metal layer 12 and reflection-preventing metal layer 13 protrudes from its top where a via hole is to be formed. A second photoresist layer 15 serving as a second mask, is formed to surround the protruded section of the metal line 19. The metal layer 12 and the reflection-preventing metal layer 13 are etched away, using the second photoresist layer 15 as the second mask. Portions of the metal line 19 except the protruding portion forming the bottom of the via hole, or the peripheral portions of the via hole are formed to have a predetermined thickness at the first insulating layer 11, as shown in FIG. 3C. The second photoresist layer 15 is removed, and the second insulating layer 16 is deposited onto the metal line 19. A third photoresist layer 8 to be patterned and serve as a third mask on exposing to light and developing the portion where a via hole is formed, is formed on the second insulating layer 16. The subsequent process is the same as that of the first preferred embodiment, and accordingly, the description thereof is omitted.

In accordance with the present invention, the portion of the metal line forming the bottom of the via hole is formed to be thicker than the peripheral areas of the via hole, and therefore, an undercut is prevented, even if the second insulating layer is etched somewhat excessively. Thus, the present invention ensures the enhancement in step coverage and reliability on a semiconductor device in case of carrying out the post metallization. Furthermore, the relatively high-resistance metal layer for preventing reflection may be removed by etching, which induces reduction of the resistance of the via hole.

While the present invention has been described in connection with what is considered to be the preferred embodiments, it is to be understood that the present invention is not limited to the disclosed embodiments, but, on the contrary, is intended to cover various modification and equivalent arrangements included within the spirit and scope of the appended claims.

What is claimed is:

1. A method for making a semiconductor device having a via hole comprising the steps of:

depositing a second metal layer onto a first insulating layer formed on a semiconductor substrate where a first metal layer is formed on a lower surface of the substrate;

forming a first photoresist layer on said second metal layer and firstly etching said second metal layer to said first insulating layer, using said first photoresist layer as a first etching mask, to form a metal line, removing said first photoresist layer, forming a second photoresist layer over said metal line, and secondly partially etching said metal line, using the second photoresist layer as a second etching mask, to define a protrusion in said metal line; and depositing a second insulating layer onto said metal line, forming a third photoresist layer on said second insulating layer, and thirdly etching said second insulating layer, using the third photoresist layer as a third etching mask, to open said via hole on said metal line.

2. A method according to claim 1, further comprising the step for depositing a third metal layer prior to the step for firstly etching the second metal layer.

3. A method according to claim 2, wherein said third metal layer is made from titanium nitride.

4. A method according to claim 1, wherein a dry etching technique is used for secondly etching said metal line and for thirdly etching said second insulating layer.

5. A method according to claim 2, wherein said third metal layer is excessively etched to reduce resistance of the via hole when said second insulating layer is thirdly etched in forming the via hole.

6. A method for making a semiconductor device having a via hole comprising the steps of:

depositing a second metal layer onto a first insulating layer formed on a semiconductor substrate where a first metal layer is formed on a lower surface of the substrate;

forming a first photoresist layer, firstly partially etching said second metal layer, using said first photoresist layer as a first etching mask to make a first metal line protruding from said second metal layer;

forming a second photoresist layer to surround the first metal line, and secondly etching said second metal layer to said first insulating layer further to make an enlarged metal line protruding from said first insulating layer and including said first metal line thereon, using said photoresist layer as a second etching mask, and then removing said second photoresist layer; and forming a second insulating layer over said enlarged metal line, forming a third photoresist layer on said second insulating layer, and etching said second insulating layer, using said third photoresist layer as a third etching mask for the formation of a via hole on said first metal line.

7. A method according to claim 6, further comprising the step for depositing a third metal layer on the second metal layer for preventing an irregular reflection when performing a photolithographic process, prior to the step for etching the second metal layer formed on the first insulating layer to form the metal line.

8. A method according to claim 7, wherein said third metal layer for preventing reflection is made from titanium nitride.

9. A method according to claim 6, wherein a dry etching technique is used for making the first metal line and for the formation of the via hole.

10. A method according to claim 7, wherein said third metal layer for preventing reflection is excessively etched to reduce the resistance of the via hole when said second insulating layer is etched for the formation of the via hole on said first metal line.

* * * * *